United States Patent
Arthur et al.

(10) Patent No.: US 8,377,756 B1
(45) Date of Patent: Feb. 19, 2013

(54) SILICON-CARBIDE MOSFET CELL STRUCTURE AND METHOD FOR FORMING SAME

(75) Inventors: Stephen Daley Arthur, Glenville, NY (US); Kevin Matocha, Starkville, MS (US); Peter Sandvik, Niskayuna, NY (US); Zachary Stum, Niskayuna, NY (US); Peter Losee, Rensselaer, NY (US); James McMahon, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/190,723

(22) Filed: Jul. 26, 2011

(51) Int. Cl.
*H01L 29/10* (2006.01)
*H01L 29/76* (2006.01)

(52) U.S. Cl. ....... 438/135; 438/202; 438/220; 438/258; 438/268; 327/424; 327/438; 257/329; 257/334; 257/341; 257/E21.41; 257/E21.418; 257/E27.06; 257/E29.257; 257/E29.262

(58) Field of Classification Search .................. 438/135, 438/202, 220, 258, 268; 327/424, 438; 257/329, 257/334, 341, E21.41, E21.418, E27.06, 257/E29.262
See application file for complete search history.

(56) References Cited

U.S. PATENT DOCUMENTS

| | | | |
|---|---|---|---|
| 4,455,565 A | 6/1984 | Goodman | |
| 5,342,797 A | 8/1994 | Sapp | |
| 5,464,993 A * | 11/1995 | Zambrano et al. | 257/140 |
| 5,622,876 A * | 4/1997 | Zambrano et al. | 438/135 |
| 5,818,282 A * | 10/1998 | Sumida | 327/424 |
| 6,072,216 A | 6/2000 | Williams | |
| 6,204,533 B1 * | 3/2001 | Williams et al. | 257/341 |
| 6,927,455 B2 | 8/2005 | Narazaki | |
| 7,459,750 B2 * | 12/2008 | Ludikhuize et al. | 257/334 |
| 7,547,585 B2 | 6/2009 | Boden | |
| 7,611,947 B2 | 11/2009 | Manabe | |
| 2004/0211980 A1 | 10/2004 | Ryu | |
| 2008/0012050 A1 | 1/2008 | Aoki | |

FOREIGN PATENT DOCUMENTS

EP 1120835 A2 8/2001

OTHER PUBLICATIONS

Saha and Cooper, A 1-kV 4H-SiC Power DMOSFET Optimized for Low ON-Resistance, IEEE Transactions on Electron Devices, vol. 54, No. 10, Oct. 2007, pp. 2786-2791.
Saha, SiC Short Channel Power DMOSFET: An Optimized Design, PhD Thesis, Purdue University, West Lafayette, Indiana, Dec. 2006.

* cited by examiner

*Primary Examiner* — Dao H Nguyen
(74) *Attorney, Agent, or Firm* — Penny A. Clarke

(57) ABSTRACT

In one embodiment, the invention comprises a MOSFET comprising individual MOSFET cells. Each cell comprises a U-shaped well (228) (P type) and two parallel sources (260) (N type) formed within the well. A plurality of source rungs (262) (doped N) connect sources (260) at multiple locations. Regions between two rungs (262) comprise a body (252) (P type). These features are formed on an N-type epitaxial layer (220), which is formed on an N-type substrate (216). A contact (290) extends across and contacts a plurality of source rungs (262) and bodies (252). Gate oxide and a gate contact overlie a leg of a first well and a leg of a second adjacent well, inverting the conductivity responsive to a gate voltage. A MOSFET comprises a plurality of these cells to attain a desired low channel resistance. The cell regions are formed using self-alignment techniques at several states of the fabrication process.

11 Claims, 5 Drawing Sheets

SILICON-CARBIDE MOSFET CELL STRUCTURE AND METHOD FOR FORMING SAME

FIELD OF INVENTION

Embodiments presented herein relate generally to a silicon-carbide (SiC) metal-oxide semiconductor field effect transistor (MOSFET) cell structure and a method for forming the SiC MOSFET.

BACKGROUND OF INVENTION

In a conventional lateral MOSFET current flows horizontally from source to drain (both source and drain regions doped with a material of a first conductivity type) along a narrow channel doped with a material of a second conductivity type. A voltage applied to a gate contact overlying the channel inverts the conductivity of the channel, allowing majority carriers to flow from source to drain. Because the channel is narrow, conventional MOSFETS have small drain currents and correspondingly low power ratings.

Power (high current) MOSFETS use many different device geometries to increase the device's maximum current and power rating. These devices have current ratings from about 1 A to 200 A and power ratings from about 1 W to more than 500 W. A typical power MOSFET is not a lateral device. Instead, current flows from a source region on a top surface of the device vertically to a drain region on a bottom surface. This vertical channel configuration allows packing more channels (and more MOSFETS) in a smaller area than a lateral MOSFET. A single die can carry more parallel vertical MOSFET elements than horizontal (lateral) MOSFET elements.

There are three types of so-called vertical MOSFETs: planar double-diffused, trench-gated, and pillar-gated. Each configuration has a unique configuration and fabrication methodology.

In the planar double-diffused type, carriers (electrons in an NMOS device) flow from a first doped region (the source) along a top surface of the device, through the channel in a body region, and then turn downwardly to a second doped region on the bottom surface (the drain). The gate is located on the top surface of the device overlying the channel. The body/channel region is formed of an opposite-conductivity material than the drain and source regions. These planar double-diffused vertical MOSFETs have a higher current capacity than their lateral counterparts.

In the trench-gated MOSFET, the gate is formed in a trench that extends vertically or near-vertically downwardly from the top surface of the device. The channel regions are formed along sidewalls of the trench. The source and drain regions can be located on a top surface of the semiconductor bulk or disposed on opposing surfaces of the bulk. Trench-gated devices are advantageous because they occupy less surface area than vertical double-diffused MOSFETs and consequently enjoy a higher device density. Pillar-gated devices are the converse of the trench-gated device.

Enhancing semiconductor device performance and increasing device density (more devices per unit area) have always been and will always be important objectives of the semiconductor industry. Device density is increased by making individual devices smaller and packing devices more compactly. Packing more devices into the same area, or even better into a smaller area, allows higher levels of system integration and in the case of power MOSFETS, increased current capacity. Since the channel length consumes considerable space in the conventional lateral MOSFET, a vertical channel conserves considerable space.

As device dimensions (also referred to as the feature sizes or design rules, and typically referring to the gate mask dimension) decrease to pack the devices more closely, methods for forming devices and their constituent elements must adapt to the smaller feature sizes. But shrinking device dimensions encounters certain manufacturing limitations, especially with respect to lithographic processes. Fabricators of such devices have therefore sometimes turned to the use of self-alignment techniques to form the various device features.

FIG. 1 illustrates a simple prior art vertical NMOSFET 10 with two source contacts (ohmic contact) 14 on each side of a gate oxide 16. A gate contact 18 overlies the gate oxide 16. N+ source regions 20 are formed in a P– well 24A. An extension of the P– well 24A comprises a P+ region 24B. The source contacts 14 short each of the N+ source regions 20 to the proximate P+ region 24B. Hereinafter, dopants for doping various MOSFET regions may be referred to as dopants of a first or a second conductivity type, where dopants of a first conductivity type can be n-type dopants or p-type dopants, and similarly dopants of the second conductivity type can be n-type dopants or p-type dopants.

An N– epitaxial drift layer 26 is disposed as shown, and an N+ substrate 28 is disposed below the N– epitaxial layer 26. A drain contact 30 is formed on the N+ substrate 28.

When a gate-source voltage is greater than a gate-source threshold voltage, (which is a characteristic of the device) channel regions 24A within the P-wells 24 are inverted. Free electrons then flow from the source regions 20 through the inverted channel regions 24A and vertically downwardly to the drain 30 along paths indicated generally by a reference character 40. Because the conducting channel is much wider than in a conventional lateral MOSFET, the current can be much larger, permitting the vertical MOSFET (VMOSFET) to function at the current and power levels required of a power MOSFET. NMOSFETS are almost universally used in high power MOSFET applications.

To increase the current capacity of a vertical power MOSFET, a geometric pattern of individual MOSFET cells (a cell comprising the vertical MOSFET 10 illustrated in FIG. 1, for example) is formed on a substrate and the MOSFETS connected in parallel. The individual cells may be in the shape of a closed figure, such as a square or hexagon, or they may be arranged in parallel longitudinal stripes. Generally, because of their operational characteristics and geometry, parallel-connected power MOSFETS have equal drain currents. In fact, it is this feature that permits parallel connection of the MOSFETS.

FIGS. 2 and 3 illustrate a top view and a cross-sectional view, respectively, of a prior art geometric pattern of cells arranged in a series of parallel longitudinal stripes. Only two adjacent MOSFETS 38 and 39 are illustrated in FIG. 2. A boundary between the MOSFETS 38 and 39 is defined by adjacent gate contact stripes 40L and 40R, which together define a gate 40. A leftmost boundary of the cell 38 is defined by a gate stripe 44L and a rightmost boundary of the cell 39 is defined by a gate stripe 46R. However, the gate stripe 44L and the gate stripe 44R comprise only one-half of their respective gates, as another gate stripe (not shown) is adjacent each of the gate stripes 44L and 44R.

Continuing with FIG. 2, an interior of the cell 38 comprises source stripes 52L and 54L and an intermediate body stripe 56L. An interior of the cell 39 comprises source stripes 58R and 60R and an intermediate body stripe 62R. The source stripes 52L, 54L, 58R and 60R and the body regions 56L and 62R are connected to respective contacts not illustrated. As shown in FIG. 3, the body region 62R extends below the source regions h58R and 60R and the body region 56L extends below the source regions 52L and 54L.

Channels are formed in the body region 62R at regions 70R and 72R by action of a voltage applied to the respective gate contacts 40R and 46R. Channels are formed in the body region 56L at locations 80L and 82L by applying a voltage to the respective gates 40L and 44L. The body regions and the source regions may be shorted to prevent a parasitic bipolar transistor (as formed at the junction) from turning on.

Continuing with FIG. 3, gate oxide layers 90L, 92L, 94R and 96R underlie the respective gate contacts 44L, 40L, 40R and 46R. An N-epitaxial layer 90 and a substrate 94 underlie the various doped regions as illustrated. A drain contact 99 is disposed on a back or bottom surface as shown.

A voltage applied to the gate contacts 44L, 40L, 40R and 46R inverts the channel regions 82L, 80L, 70R and 72R, permitting carriers to flow from the source regions 54L, 52L, 58R and 60R through the inverted channel regions to the drain contact 99.

The channel resistance is one of the largest components of the total on-state resistance between the source and drain in a MOSFET, referred to as $R_{DS(ON)}$. The other resistive components arise in a vertical or power MOSFET due to: source contact resistance, resistance to lateral flow of electrons across the source, channel resistance, JFET resistance through a constricted channel along the surface current path between the P-well regions, resistance across the N− epitaxial region (the current spreads out as it flows vertically), substrate resistance as the current flow vertically across the N+ substrate, and finally drain contact resistance. The channel resistance component can be as much as about 40% of $R_{DS(ON)}$ for a 1200 volt SiC device, which is in part due to the poor mobility of the inversion layers in SiC. Thus short channels and high channel density may be desired.

The channel resistance is directly related to the mobility of the carriers within the (inverted) channel. For a silicon MOSFET the carrier mobility is about 200 cm$^2$/V-s. For silicon carbide the mobility falls to about 20 cm$^2$N-s. Thus silicon carbide material has a higher channel resistance. To overcome this disadvantage of silicon carbide, it is desirable to make the channel very short and densely pack them to increase the number of vertical channels per unit area. The vertical channels within the device are connected in parallel and act like parallel resistors, which therefore lowers the total channel resistance of the power MOSFET. The more channels that can be squeezed into a unit area the smaller the resistance of the parallel-connected MOSFET channels.

Notwithstanding its greater channel resistance, silicon carbide offers certain advantages over a silicon power MOSFET. These advantages are a consequence of the inherent material characteristics of SiC over Si, including a wider bandgap (3.2 eV), a higher voltage breakdown strength (2.2 MV/cm) and a higher thermal conductivity (~3W/cm-K). But processing issues associated with the use of SiC material, including poor SiC-oxide interfaces and premature breakdown of the gate oxide, have disfavored widespread use of this material for commercial devices.

Various fabrication processes and device structures have been used to provide accurate and reliable regions of power MOSFET devices, some of which have been described above. However, continued improvements are needed, especially as feature dimensions shrink and alignment tolerances become more difficult to satisfy. But self alignment techniques provide accurate and repeatable device structures and therefore increases device yield. Therefore use of self alignment techniques while shrinking feature sizes allows the devices to be packed more tightly. Shrinking cell dimensions reduces the channel length, lowering the ON state channel resistance ($R_{DS(ON)}$).

BRIEF DESCRIPTION

In one embodiment, a method comprising, forming a well within a first material layer, the well having a generally U-shape in an XY cross-sectional plane, the first material layer doped a first conductivity type, the well doped a second conductivity type and an intermediate region between upright legs of the U-shaped well doped a first conductivity type; forming first and second sources within the intermediate region, the first and second sources spaced apart in an X direction and doped the first conductivity type; forming body regions within the intermediate region, the body regions between the first and second sources and doped a second conductivity type; forming source rungs within the intermediate region; wherein forming the first and second sources, forming the body regions and forming the source rungs each comprise employing a self-aligning technique further comprising masking the first and second sources, masking rung regions connecting the first and second sources and counter-doping exposed regions to a second conductivity type; wherein a body region is disposed between two consecutive source rungs, each source rung extending in the X direction and the source rungs spaced-apart in the Z direction, each source rung connecting the first and second sources at different locations along the first and second sources; and determining a ratio of a source rung area and a body region area to control a contact resistance between of the source rungs and the body regions.

In another embodiment, a semiconductor device is provided. The semiconductor device comprises at least a first and a second semiconductor cell each comprising material regions extending in a Z direction, the regions spaced apart in an X direction; the first and the second semiconductor cells each comprising: a substrate; a drain contact on a first surface of the substrate; an epitaxial layer on a second surface of the substrate, the second surface opposite the first surface, the epitaxial layer doped a first dopant type; a first doped region extending in a Y direction from an upper surface of the epitaxial layer and doped a second dopant type; a first and a second source spaced apart in the X direction, disposed within the first doped region, and doped the first dopant type, the first and second sources formed in a self-aligned manner relative to the first doped region; source rungs in the first doped region, each source rung connecting the first and second sources at a different location along the first and second sources, the source rungs alternating with first doped regions and formed in a self-aligned manner relative to the first and second sources, the source rungs comprising dopants of the first dopant type; and wherein an area of the source rungs and an area of the first doped regions are independently determinable responsive to a contact resistance of the source rung and a contact resistance of the first doped region.

DRAWINGS

DETAILED DESCRIPTION

Figure 1:
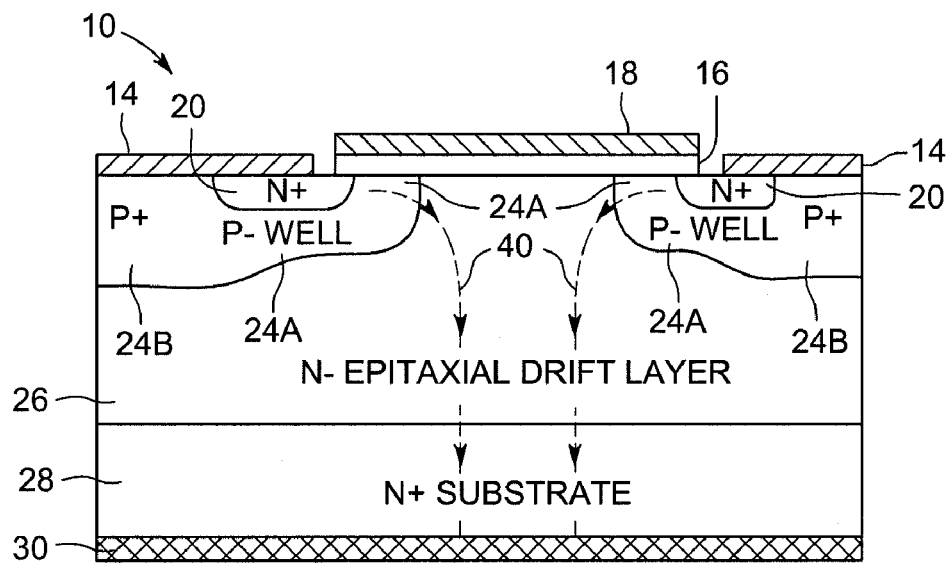
FIG. 1 depicts a prior art power MOSFET.
Figure 2:
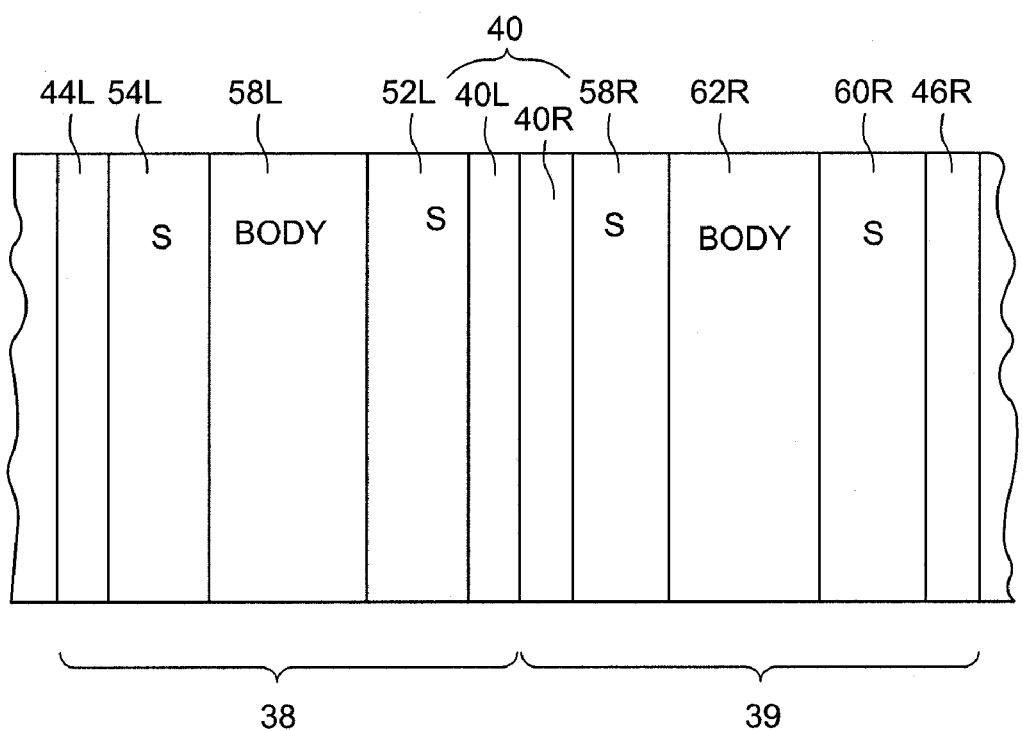
FIGS. 2 and 3 depict respective top and cross-sectional views of a prior art power MOSFET comprising a plurality of individual cells oriented in a stripe configuration.
Figure 3:
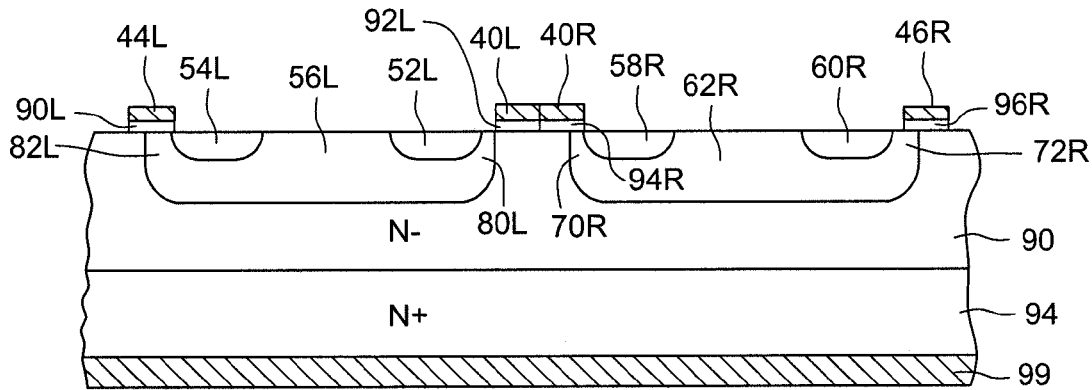

Before describing in detail the particular power MOSFET and the methods for forming such a power MOSFET (and the individual cells that constitute the power MOSFET) it should be observed that embodiments presented herein include a novel and non-obvious combination of elements and fabrication steps. So as not to obscure the disclosure with details that will be readily apparent to those skilled in the art, certain conventional elements and steps have been presented with lesser detail.

The presented embodiments are not intended to define limits of the structures, elements or methods of the inventions, but only to provide example constructions. The embodiments are permissive rather than mandatory and illustrative rather than exhaustive.

One advantageous feature that may be present in some embodiments provided herein is the channel-source self-alignment accomplished by forming strategically placed spacers for use during subsequent doping steps. Another advantageous feature that may be present in some embodiments provided herein is the ability to control or determine, and therefore change, the areas of the body and source contacts (ohmic contacts).

In one embodiment, a self-aligned NMOSFET process is provided that can be advantageously used to shrink cell pitch and substantially reduce the lithography challenges for small, center-cell P+ contacts (i.e., the contacts located in a center region of the P+ body region).

Generally, self-alignment of doped regions is characterized by alignment of one layer or feature in a semiconductor device to another layer or feature as a result of physical processes not directly related to optical lithography. For example, in fabricating a conventional MOSFET, the gate oxide and gate contact are formed over the substrate. The oxide is etched from over the source and drain regions while the gate electrode blocks the etchant from reaching the underlying gate oxide. After this etch step, the source and drain regions are implanted with dopants. Thus the gate oxide and gate contact align the source and drain doped regions with the gate structures by defining the location of the source and drain regions and also serve as a doping block while the source and drain dopants are implanted.

In some embodiments, use of spacers and spacer extensions, as described below, define the regions to be doped or counter-doped. The spacer and spacer extensions are formed and their dimensions controlled by physical processes, rather than photolithography techniques. Use of self-alignment techniques allows the designer to further shrink the size of cell elements, packing more MOSFET cells into a MOSFET device thereby increasing the current capacity of the device.

The benefits of self alignment generally include allowing the formation of smaller feature size elements and avoiding lithographic defects (e.g., mask misalignment, alignment tolerances, and resist errors). Self-alignment tolerances are instead controlled by physical processes. As an example, self-alignment through spacer formation, as described below, is achieved by properly proportioning a spacer width relative to a thickness of a CVD deposited hard mask film. The hard mask film thickness and the deposition process that controls it is adjustable over a useful range and easily verified through common fabrication optical metrology tools. Thus this process sequence results in controllable submicron features.

The strip cell design presented herein, which is used to scale the MOSFET size, is optimized using self-alignment techniques. This design achieves both improved yield and improved performance.

Figure 10:
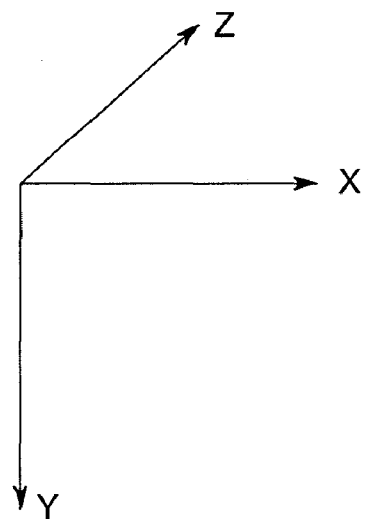
FIG. 10 depicts a coordinate system for use in describing embodiments presented herein.

An XYZ coordinate system (see FIG. 10) is used as a reference system to describe the various features illustrated in the figures of the application. An X axis is defined from a right side to a left side of the structure, with the X value increasing moving from left to the right. A Y axis extends vertically with Y=0 defined at a surface of an initial semiconductor material, with positive Y values extending downwardly into the semiconductor substrate and negative Y values extending upwardly. A Z axis extends into the paper or display surface, increasing in value extending into the paper or display surface. The three axes system of FIG. 10 is merely exemplary and conveniently instructive for describing the presented embodiments. As known by those skilled in the art, the system can be rotated to form other coordinate systems, for example, with the Z-axis pointing down, while satisfying the right hand rule that governs the relationship among the X, Y and Z axes. While the elements of the presented embodiments are described relative to the coordinate system of FIG. 10, other orientations of the elements according to other coordinate systems are deemed to fall within the scope of the presented embodiments.

A cell pitch is defined as an X-direction distance between a feature in one cell and the same feature in an adjacent cell, where each cell comprises features (source, body, well, etc.) that extend in the Z direction. An XY plane comprises a plane formed by the X and Y axes of the coordinate system.

Figure 4:
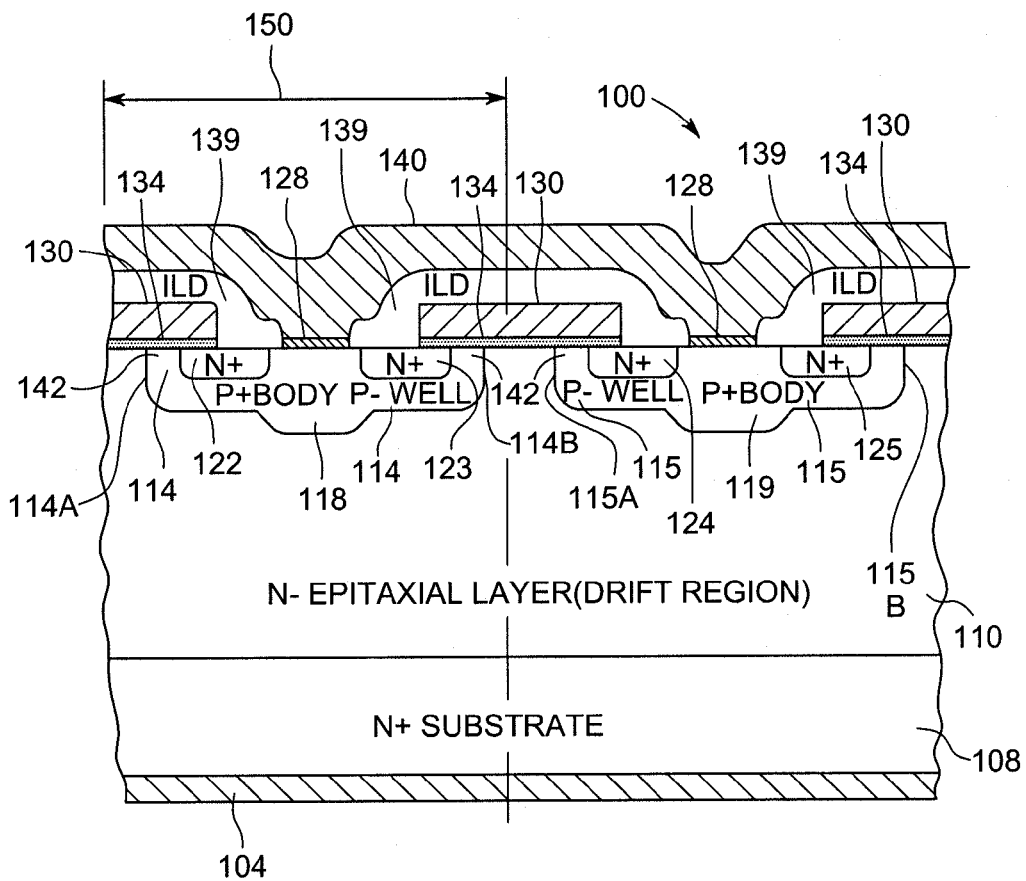
FIG. 4 depicts a cross-sectional view of a power MOSFET structure.

FIG. 4 depicts a cross-sectional view of a power MOSFET 100. As illustrated, the MOSFET 100 comprises a drain contact 104, an N+ substrate 108, an N− drift region 110 (or epitaxial layer 110), P− wells 114 and 115, P+ body regions 118 and 119, and N+ source regions 122, 123, 124 and 125. The drain contact 104 can be regarded as disposed on a first surface of the N+ substrate 108 and the epitaxial layer 110 disposed on a second surface of the N+ substrate 108. The various doped and undoped layers or regions of the MOSFET device may also be referred to as material layers or material regions.

As illustrated, the P+ body regions 118 and 119 are disposed approximately in a central region of the respective P− wells 114 and 115. The P− wells 114 and 115 have a generally U-shape comprising an intermediate region (the P+ body regions 118 and 119 disposed in the respective intermediate regions) between two upright legs. The N+ source regions 122, 123, 124 and 125 are spaced apart from respective end walls 114A, 114B, 115A and 115B of the P− wells 114 and 115.

Gate contacts 130 (typically comprising polysilicon) and a gate oxide layer 134 overlie portions of the N+ source regions 122, 123, 124 and 125 as illustrated, and end regions of the P− wells 114 and 115 as illustrated. Source contact stripes 128 (typically comprising aluminum overlying a contact metal, e.g., nickel) are disposed in contact with the P+ body regions 118 and 119 as shown in FIG. 4. The source contact stripes 128 also contact the source regions 122, 123, 124 and 125 outside the plane of FIG. 4 and are discussed in conjunction with FIG. 9.

Inter-layer dielectric (ILD) layer 139 electrically isolates the source contact stripes 128 from the gate contact 130 to prevent gate-to-source shorts. A source contact metal layer 140 (in one embodiment about 4 μm thick) is formed over the ILD layer 139 and the source contact stripes 128.

Channel regions 142 are formed within the P– wells 114 by application of a positive voltage on the gate contact 130 that exceeds a gate threshold voltage of the MOSFET. When the channel is formed, current can flow from source to drain as in any conventional MOSFET.

The following figures depict process flow steps and the resulting formed structures along a small portion of a MOSFET stripe.

Figure 5:
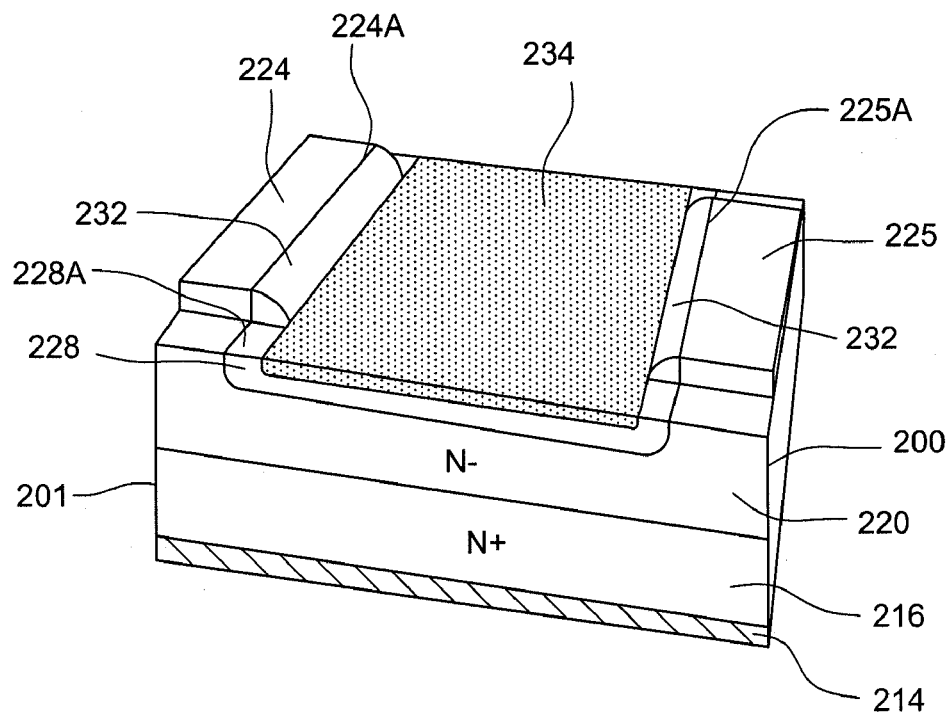
FIGS. 5-9 are perspective views illustrating formation of various features of the power MOSFET of FIG. 4 during successive process steps.

The features illustrated in FIGS. 5-9 can be reflected along a right side surface 200 of FIG. 5 and along a left side surface 201 to form a plurality of stripes (in the X direction) in the final power MOSFET. Also, the various described regions (e.g., source, body, well) extend in the Z direction.

A line 150 in FIG. 4 indicates regions of the FIG. 4 cross-section that are illustrated in FIGS. 5-9.

FIG. 5 illustrates a drain contact 214 (referred to as a backside drain contact) disposed on one surface of an N+ substrate 216. The drain contact 214 is conventionally formed during the final fabrication steps for forming the MOSFET. An N– epitaxial drift layer 220 is formed according to known techniques over the N+ substrate 216.

First and second parallel spaced-apart hard masks 224 and 225, each having a respective vertical sidewall 224A and 225A, are formed according to known techniques (e.g., blanket depositing a first blanket hard mask followed by hard mask etching) over a respective region of an upper surface of the epitaxial drift layer 220. Generally, a center line extends in a Z direction between the hard masks 224 and 225.

A P– well region 228 is formed in an upper region of the N– epitaxial layer 220 and between the hard masks 224 and 225 (i.e., the hard masks 224 and 225 masking or covering the structures below the hard masks 224 and 225) by implanting a P type dopant (counterdoping) to counter-dope the N– epitaxial layer 220. Typically the P– well extends in a Y direction about 1 µm or less from an upper surface 228A of the P– well region 228. Other P– well depths may be attained with higher energy ion implantations, noting that there is little vertical ion or dopant diffusion in silicon carbide. As shown, the P– well region 228 extends in the Z direction.

The hard masks 224 and 225 extend over the entire upper surface of the N– epitaxial drift layer 220 before the etching process is performed. FIG. 5 actually illustrates a cut-away view as upper surfaces of the P– well 228 and the N– epitaxial drift layer 220 are both visible in the Figure.

A chemical vapor deposition (CVD) process forms a second blanket hard mask over the structure, followed by a directional etch to form first and second hard mask spacers 232 in FIG. 5. The spacers 232 are self-aligned to the P– well region 228 and overlie edge regions of the P– well region 228, shielding the regions that they overlie during a subsequent dopant implantation step. In effect, a centerline of the cell passes between the first and second spacers 232. The dimensions of the spacers 232 are precisely controlled by controlling a deposition thickness of the hardmask material and by controlling the directional etching process. Precise dimensional control of the dimensions of the spacers 232 fixes the controllable and uniform submicron channel lengths, as the channels will be formed during MOSFET operation in those regions of the P– wells 228 that are immediately below the spacers 232.

Implanting N+ ions into exposed regions of the P– well region 228 forms an N+ region 234 (from which the source regions will later be formed) within an upper surface of the P– well region 228 (i.e., a counterdoping process). The N+ implant doses are higher than the doping of the P– well region, thus compensating the P– well region doping to create the N+ region 234. During the implant process the hard masks 224, 225, and 232 prevent implanting ions in regions below these hard masks. This step of implanting source ions allows for self-alignment of the channel to the later-formed sources.

Figure 6:
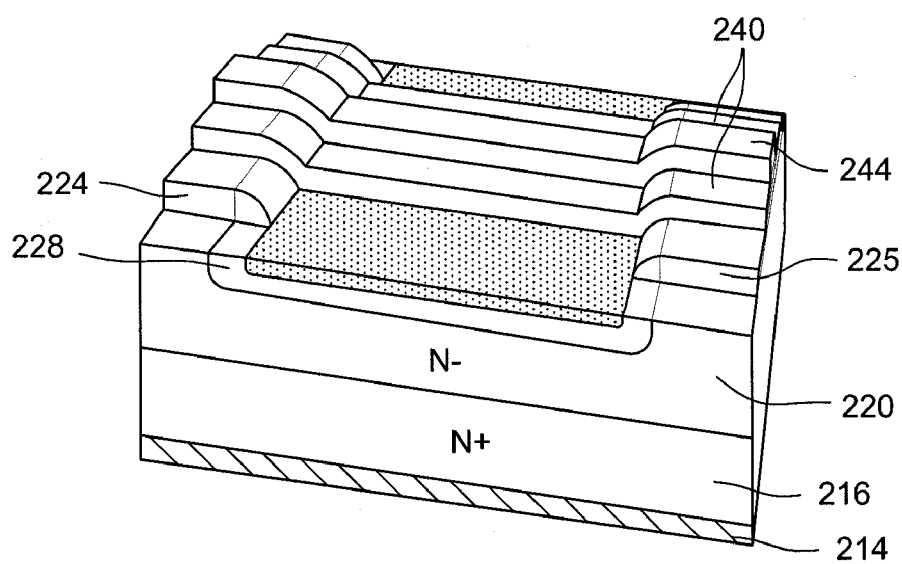

A third blanket hard mask 240 (see FIG. 6) is formed as a blanket layer that completely covers an upper surface of the structure (only a portion of the third hard mask 240 is illustrated in FIG. 6). A resist stripe 244 is formed atop the hard mask 240 across a complete width of the structure. Multiple such resist stripes are formed each extending in the X-direction and the multiple resist stripes spaced-apart along the Z-direction.

Figure 7:
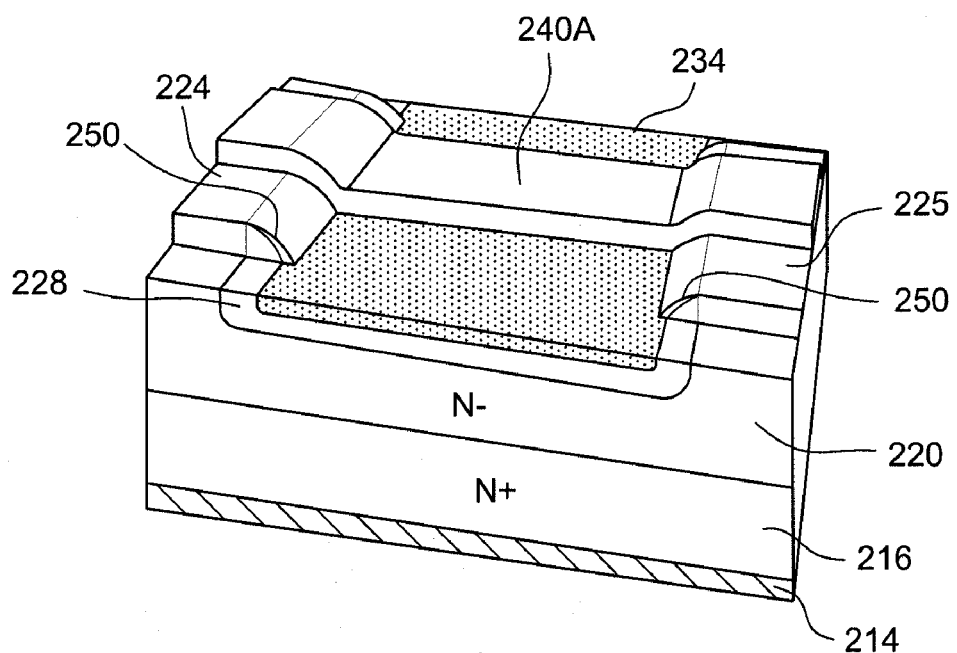

The hard mask 240 is directionally etched (with a predominant vertical component) to remove all regions of the hard mask 240 except the regions beneath the resist stripe 244 and except first and second spacer extensions as described below. After the hard mask etch, the resist is removed to leave a hard mask region 240A as shown in FIG. 7.

The directional etch also forms first and second spacer extensions 250 (adjacent the first and second spacers 232 such that the cell centerline also extends between the first and second spacer extensions 250) that serve as masks to provide self-alignment for a subsequent compensating (counterdoping) P+ implant into the N+ region 234 that forms a body region, such as the body region 119 of FIG. 4. The spacer extensions 250 extend toward a center line of the cell in the range of about 0.25 to about 2.0 µm measured from an edge of the spacers 232.

Figure 8:
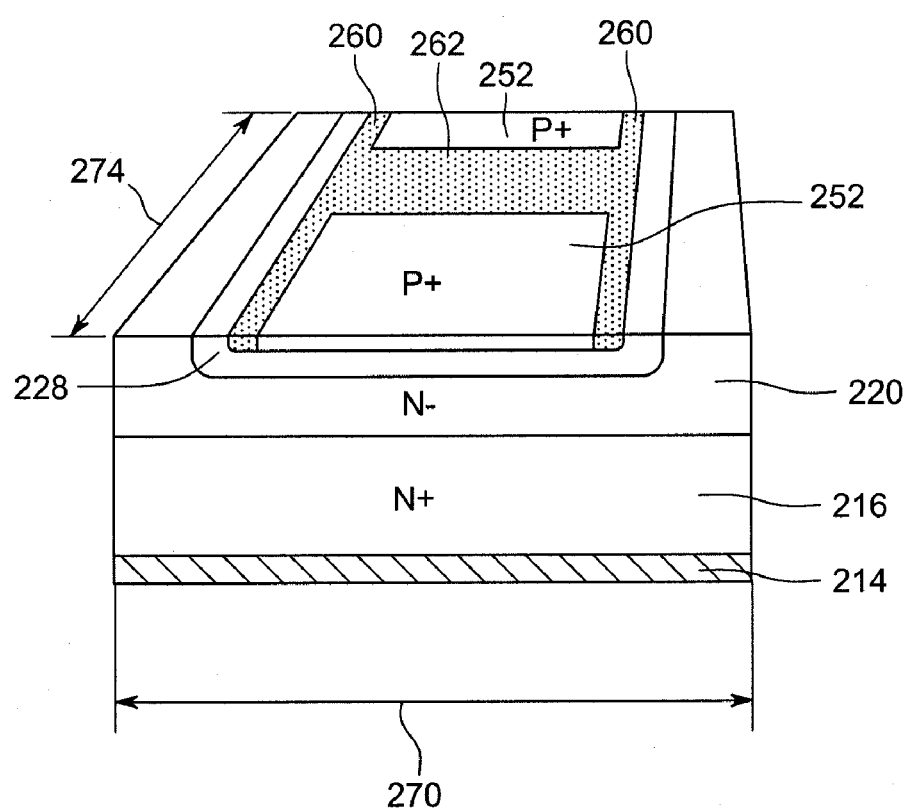

FIG. 8 illustrates a P+ body region 252 formed by counterdoping the N+ region 234 with the hard mask region 240A (shown in FIG. 7) in place and shielding regions of the N+ region 234 from the implant ions. The shielded regions will become the sources as described below.

After removing the hard mask region 240A, the device (referred to as a unit cell of the power MOSFET) resembles FIG. 8. The cell doping is complete. As illustrated in FIG. 8, the unit cell comprises the P– well 228 and first and second N+ sources 260 (or source region stripes 260) extending along the cell length (i.e., in the Z-direction). Although only two P+ body regions 252 and one N+ source rung 262 is shown in FIG. 8, the complete cell comprises a plurality of P+ body regions 252 alternating with the N+ source ladder rungs (or source rungs) 262 along the cell length. The source rungs 262 connect the first and second N+ sources 260 at different locations along the first and second sources 260.

All these MOSFET features have been formed using the described self-alignment processes. In particular, the N+ source regions ladder rungs 262 are self-aligned to the channel (which is formed within the P– well 228 during operation of the device) and the edges of the P+ body region 252 are self-aligned to the N+ source region stripes 260.

A cell pitch dimension is identified by a reference character 270 and a unit cell length dimension by a reference character 274 in FIG. 8.

It can be seen from comparing FIGS. 4 and 8 that the two source regions 122 and 123 in FIG. 4 comprise the two parallel source regions stripes 260 in FIG. 8. The P+ body region 118 comprises the P+ body region 252 in FIG. 8. The P– well 114 comprises the P– well 228 in FIG. 8. The line 150 in FIG. 4 indicates the regions of the FIG. 4 cross-section that are illustrated in FIG. 8. The source regions 124 and 125, the P+ body region 119 and the P– well 115 on the right side of FIG. 4 represent another contact stripe that is not shown in FIG. 8.

After the processes associated with FIG. 8 have been completed, the cell is annealed to activate the implanted ions. Any exposed oxide on the wafer will not survive at the anneal temperature; the wafer is therefore stripped bare and coated with a high temperature overcoat material to prevent the silicon atoms from diffusing out from the wafer into the gas phase during the anneal process. Alternatively, the anneal process is performed using silane as the ambient gas. The silane gas partial pressure prevents the evaporation of the silicon atoms from the wafer cell.

Figure 9:
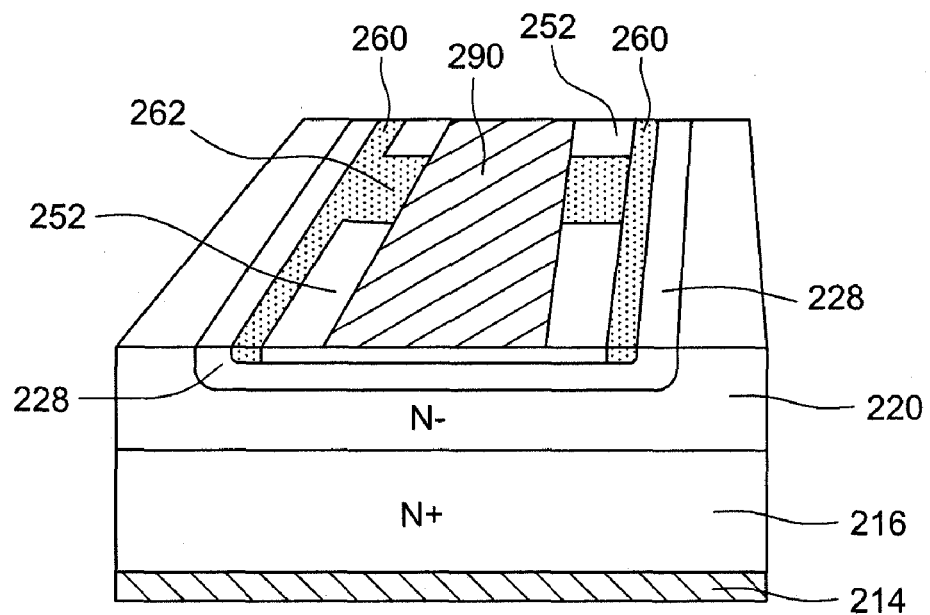

FIG. 9 illustrates a single continuous contact 290 (or a contact stripe 290) that is also formed after the anneal step. The contact 290 contacts both the P+ body regions 252 and the N+ source rungs 262, which are in conductive communication with the source region stripes 260.

The structures above the upper surface of the cell (as depicted in FIG. 4) are then formed. The gate oxide (reference character 134 in FIG. 4) is grown and patterned and the gate polysilicon contact (reference character 130 in FIG. 4) is formed. The inter-layer dielectric (reference character 139 in FIG. 4) is deposited and a contact window stripe is opened in the ILD to permit contact to the continuous contact stripe 290. This effectively permits contact to the P+ body regions 252, the N+ source region ladder rungs 262 and the source regions stripes 260, which are all in electrical communication with the contact stripe 290.

Note that contact with both the P+ body regions and the source region ladder rungs are made along a single stripe, thereby avoiding the tight tolerances required by lateral P+ and N+ regions of a conventional MOSFET. This feature permits smaller stripe pitch with an increase in channel density, which reduces the $R_{DS(ON)}$ parameter. The self-alignment processes and ladder cell geometry presented herein reduce the design and manufacturing constraints that are placed on the ohmic contact pattern, since the contact pattern is formed by the single stripe across both N+ source rungs and P+ body regions. Use of the single stripe allows the lateral cell width dimensions to be minimized.

Note also in FIG. 9 that the P− well region 228 and the P+ body region 252 are in contact, essentially creating a continuous P type region. This feature can also be seen in FIG. 4 relative to the P− well regions 114 and 115 in contact with respective P+ body regions 118 and 119. Thus the ohmic contact between the contact stripe 290 and the P+ body region 252 fixes the potential at both the P+ body region 252 and the P− well region 228.

Note that the ohmic contact to the N+ source region ladder rungs also serves as the ohmic contact to the N+ source region stripes 260, since the rungs and the stripes are in contact.

The depth of the P+ body region 118 or 119 in FIG. 4 is illustrated as deeper than the N+ source regions 122, 123, 124 or 125. Whereas in FIG. 9, the P+ body region 252 is shown at approximately the same depth as the source regions stripes 260. Since dopants undergo very little diffusion in silicon carbide, the dopant depths are determined substantially by the dopant implant energy. Controlling that implant energy thus determines the dopant depth profiles. The implant energy, and as a consequence the dopant depths, is selected based on the desired operating parameters of the final MOSFET. Thus the dopant profiles illustrated in FIGS. 4 and 9 may be appropriate.

It is known that when aluminum is used as the contact metal for silicon MOSFETS (or for any silicon-based semiconductor), a good low-ohmic contact can be formed for both P type and N type regions. But, this is not the case with silicon carbide.

Nickel is typically used for contacts to N-doped SiC materials with good results, i.e., a low resistance ohmic contact. But using nickel as the contact metal for P-doped regions does not yield a low contact resistance. To overcome this disadvantage an area of each contact region can be determined to minimize the contact resistance of the P+ body region when nickel is used as the contact metal.

Use of the ladder cell configuration (and the corresponding fabrication methodology) may allow the use of geometric compensation to overcome the adverse effects of the high contact resistance associated with the use nickel contacts to P-type doped regions. That is, the area of the N+ source region ladder rungs 262 and the area of the P+ body 252 can be varied (within a given cell unit length) to yield two relatively low contact resistances. Varying the individual areas can also vary the ratio of the areas; thus this technique is also referred to as area ratio control. The areas are varied by altering the area of the hard mask and resist stripe that are used to form these structures.

The benefits of the ladder cell geometry are evident particularly when combined with the self-aligned described contact process. For example, employing the designs and processes presented herein, it may be possible to reduce the cell pitch from about 11.0 µm to about 8.8 µm reduction of 20%.

As can now be appreciated, the teachings presented herein can be employed to fabricate MOSFET cells as densely as desired up to a maximum channel length per unit area. Also, self-alignment of the various doped regions by using hard masks and hard mask extensions forms source region ladder rungs across the cell. Further use of an ohmic contact stripe avoids alignment issues that require tight tolerances. This tightens the side to side tolerances of cell while at same time shrinking side to side dimensions (thereby yielding more channels per unit area).

Electrical contact along the source region ladder rungs 262 does not require a close alignment tolerance when the ILD 139 (see FIG. 4) is opened to access the rungs. Due to certain lithography constraints, it is generally easier to maintain a tight tolerance for a line feature than for a closed area feature. Embodiments presented herein take advantage of that premise to access a contact on the ladder rungs 262. This ability to maintain tight line tolerances allows reducing the cell pitch and placing more stripes within the MOSFET device or more channels per device area.

Although the embodiments presented herein have been described in the context of a silicon carbide semiconductor device, those skilled in the art recognize that the described methods and structures can be employed with silicon or silicon carbide semiconductor materials, and with any semiconductor material that can be doped to form P and N regions and PN junctions where those regions are in contact.

In another embodiment an area ratio of the area of the N+ source region ladder rungs 262 and the area of the P+ body 252 is graded (i.e. varied as a function of location or distance from a predetermined point or line). This technique increases the efficiency of one contact at different locations on the device. For example, regions that are farther from the gate contact are less efficient than those closer to the gate contact. An increase in efficiency and reliability may result if the contact resistance is relatively higher at regions that are closer to the gate contact and lower at regions that are more distant from the gate contact.

The various elements of the MOSFET device have been described as striped elements. See for example, the P− well region 228 and the N source regions stripes 260. However, in another embodiment the device elements may be formed in a rectangular shape if the aspect ratio of the rectangular shape is sufficiently large to accommodate a sufficient number of N+ source region ladder rungs 262 each of sufficient length.

In one embodiment a Z-direction length of the P+ body region 252 is about 6 µm and the N+ladder rungs 262 can be as short as 2 µm. A repeat interval in the Z direction for the cells that comprises a MOSFET is about 8 µm (6+2=8 µm). A cell pitch can range from a minimum value of about 7.0 µm.

A MOSFET device fabricated according to processes presented herein may have an on state specific channel resistance of as low as about 1 milliohms-cm^2 and a lower limit for the specific drain-source resistance of about 5 milliohms-cm^2. To determine these specific resistance values, certain assumptions were made regarding physical parameters, dimensions, process technologies, and voltages (e.g., threshold voltage and breakdown voltage) for the MOSFET under consideration. Changing one or more of these underlying assumptions will alter the specific channel and specific drain-source resistance values from those given.

The various described embodiments may display all the advantages of the prior art vertical MOSFETS, but importantly may allow contact area adjustment (area ratio control) to overcome the disadvantages associated with the contact resistance to a P-type SiC semiconductor material.

While various embodiments have been described, many variations and modifications will become apparent to those skilled in the art. Accordingly, it is intended that the inventions not be limited to the specific illustrative embodiments but be interpreted within the full spirit and scope of the appended claims.

Although described primarily with reference to use in power MOSFETS, the techniques and structures presented herein can also be employed with other vertical MOSFETS or in other semiconductor devices.

Although described for an NMOSFET, the teachings are also applicable to a PMOSFET and the processing steps for forming a PMOSFET.

This written description of the embodiments of the invention uses examples to disclose the inventions, including the best mode, and also to enable any person skilled in the art to make and use the inventions. The patentable scope of the inventions is defined by the claims, and may include other examples that occur to those skilled in the art. Such other examples are intended to be within the scope of the claims if they have structural elements or process steps that do not differ from the literal language of the claims, or if they include equivalent structural elements or process steps with insubstantial differences from the literal language of the claims.

The invention claimed is:

1. A method comprising:
   forming a well within a first material layer, the well having a generally U-shape in an XY cross-sectional plane, the first material layer doped a first conductivity type, the well doped a second conductivity type and an intermediate region between upright legs of the U-shaped well doped a first conductivity type;
   forming first and second sources within the intermediate region, the first and second sources spaced apart in an X direction and doped the first conductivity type;
   forming body regions within the intermediate region, the body regions between the first and second sources and doped a second conductivity type;
   forming source rungs within the intermediate region;
   wherein forming the first and second sources, forming the body regions and forming the source rungs each comprise employing a self-aligning technique further comprising masking the first and second sources, masking rung regions connecting the first and second sources and counterdoping exposed regions to a second conductivity type;
   wherein a body region is disposed between two consecutive source rungs, each source rung extending in the X direction and the source rungs spaced-apart in the Z direction, each source rung connecting the first and second sources at different locations along the first and second sources; and
   determining a ratio of a source rung area and a body region area to control a contact resistance between of the source rungs and the body regions.

2. The method of claim 1 further comprising:
   forming a drain contact on a first surface of a substrate, the substrate doped a first conductivity type; and
   forming an epitaxial layer on a second surface of the substrate, the first surface opposite the second surface, the epitaxial layer doped a first conductivity type, the epitaxial layer comprising the first material layer.

3. The method of claim 2 wherein forming the well comprises:
   forming parallel spaced-apart first and second masks over an upper surface of the epitaxial layer, a center line extending in a Z direction between the first and second masks; and
   counterdoping exposed regions of the epitaxial layer between the first and second masks with dopants of a second conductivity type to form the well that extends in a Z direction and in a Y direction from the upper surface of the epitaxial layer.

4. The method of claim 3 wherein forming the first and second sources, forming the body regions, and forming the source rungs comprise:
   forming first and second spacers adjacent the respective first and second masks, the first and second spacers overlying respective edge regions of the well, the center line between the first and second spacers;
   counterdoping exposed regions of the well between the first and second spacers with dopants of the first conductivity type to form a second material layer;
   forming a third blanket mask;
   forming a plurality of resist stripes over the third mask, each resist stripe extending in the X direction and the plurality of resist stripes spaced-apart along the Z direction;
   forming first and second spacer extensions from the third mask, the first and second spacer extensions adjacent the respective first and second spacers, the centerline between the first and second spacer extensions;
   counterdoping exposed regions of the second material layer between the first and second spacer extensions with dopants of the second conductivity type to form a body region bounded by the first and second spacer extensions and two consecutive resist stripes;
   wherein after forming the body region, regions under the first and second spacer extensions comprise the respective first and second sources of the first conductivity type; and
   wherein regions under the plurality of resist stripes each comprises a source rung having dopants of the first conductivity type, wherein each source rung connects the first and second sources at different locations along the first and second sources.

5. The method of claim 4 wherein the first, second and third masks comprise first, second and third hard masks.

6. The method of claim 4 wherein forming the first and second spacers comprises forming a blanket hard mask over the semiconductor cell and directionally etching the blanket hard mask.

7. The method of claim 1 wherein the dopants of the first and the second conductivity type comprise respectively dopants of the N conductivity type and dopants of the P conductivity type or respectively dopants of the P conductivity type and dopants of the N conductivity type.

8. The method of claim 1 wherein a ratio of the area of each source rung and the area of each body region is determinable responsive to a contact resistance of the source rung and the contact resistance of the body region.

9. The method of claim 1 wherein a material of the semiconductor cell comprises a semiconductor material capable of receiving dopants for forming P regions, N regions.

10. The method of claim 1 wherein forming the contact comprises forming a nickel layer in contact with the source rungs and the body regions and forming an aluminum layer over the nickel layer.

11. The method of claim 1 wherein the well, the body regions, and the first and second sources each have a stripe shape extending in a Z direction or have a rectangular shape.

\* \* \* \* \*

UNITED STATES PATENT AND TRADEMARK OFFICE
CERTIFICATE OF CORRECTION

PATENT NO. : 8,377,756 B1
APPLICATION NO. : 13/190723
DATED : February 19, 2013
INVENTOR(S) : Arthur et al.

Page 1 of 1

It is certified that error appears in the above-identified patent and that said Letters Patent is hereby corrected as shown below:

In the Specifications:

In Column 3, Line 2, delete "h58R" and insert -- 58R --, therefor.

In Column 3, Line 39, delete "20 cm$^2$N-s." and insert -- 20 cm$^2$/V-s. --, therefor.

Signed and Sealed this
Twenty-third Day of April, 2013

Teresa Stanek Rea
*Acting Director of the United States Patent and Trademark Office*